US009161448B2

(12) United States Patent
Menard et al.

(10) Patent No.: US 9,161,448 B2

(45) Date of Patent: Oct. 13, 2015

(54) LASER ASSISTED TRANSFER WELDING PROCESS

(75) Inventors: Etienne Menard, Durham, NC (US); Matthew Meitl, Durham, NC (US); John A. Rogers, Champaign, IL (US)

(73) Assignee: Semprius, Inc., Durham, NC (US)

( * ) Notice: Subject to any disclaimer, the term of this patent is extended or adjusted under 35 U.S.C. 154(b) by 616 days.

(21) Appl. No.: 13/352,876

(22) Filed: Jan. 18, 2012

(65) Prior Publication Data

US 2012/0115262 A1 May 10, 2012

Related U.S. Application Data

(63) Continuation-in-part of application No. PCT/US2011/029365, filed on Mar. 22, 2011.

(60) Provisional application No. 61/318,522, filed on Mar. 29, 2010.

(51) Int. Cl.
*H01L 21/00* (2006.01)
*H05K 1/18* (2006.01)
(Continued)

(52) U.S. Cl.
CPC .............. *H05K 1/18* (2013.01); *H01L 21/6835* (2013.01); *H01L 21/76898* (2013.01); *H01L 23/481* (2013.01); *H01L 23/544* (2013.01); *H01L 24/08* (2013.01); *H01L 24/24* (2013.01); *H01L 24/29* (2013.01); *H01L 24/73* (2013.01); *H01L 24/75* (2013.01); *H01L 24/799* (2013.01); *H01L 24/83* (2013.01); *H01L 24/97* (2013.01);
(Continued)

(58) Field of Classification Search
None
See application file for complete search history.

(56) References Cited

U.S. PATENT DOCUMENTS 5,205,032 A * 4/1993 Kuroda et al. .................. 29/740
2001/0040298 A1* 11/2001 Baba et al. .................... 257/778
(Continued)

FOREIGN PATENT DOCUMENTS

WO WO 2005088704 A1 9/2005
WO WO 2007037106 A1 4/2007
(Continued)

OTHER PUBLICATIONS

Notification of Transmittal of the International Search Report and the Written Opinion of the International Searching Authority, or the Declaration, PCT/US2013/021686, Date of Mailing: Jul. 8, 2013, 21 pages.
(Continued)

*Primary Examiner* — Charles Garber
*Assistant Examiner* — Evren Seven
(74) *Attorney, Agent, or Firm* — Myers Bigel Sibley & Sajovec, PA

(57) ABSTRACT

A method of printing transferable components includes pressing a stamp including at least one transferable semiconductor component thereon on a target substrate such that the at least one transferable component and a surface of the target substrate contact opposite surfaces of a conductive eutectic layer. During pressing of the stamp on the target substrate, the at least one transferable component is exposed to electromagnetic radiation that is directed through the transfer stamp to reflow the eutectic layer. The stamp is then separated from the target substrate to delaminate the at least one transferable component from the stamp and print the at least one transferable component onto the surface of the target substrate. Related systems and methods are also discussed.

27 Claims, 12 Drawing Sheets

10

32 20

30

(51) Int. Cl.

| | |
|---|---|
| ***H01L 21/683*** | (2006.01) |
| ***H01L 21/768*** | (2006.01) |
| ***H01L 23/48*** | (2006.01) |
| ***H01L 27/12*** | (2006.01) |
| ***H01L 27/146*** | (2006.01) |
| ***H01L 31/0203*** | (2014.01) |
| ***H01L 31/048*** | (2014.01) |
| ***H05K 13/04*** | (2006.01) |
| ***H01L 23/544*** | (2006.01) |
| *H01L 23/00* | (2006.01) |
| *H01S 5/022* | (2006.01) |

(52) U.S. Cl.

CPC ........... *H01L 24/98* (2013.01); *H01L 27/1214* (2013.01); *H01L 27/1266* (2013.01); *H01L 27/14618* (2013.01); *H01L 31/0203* (2013.01); *H01L 31/048* (2013.01); *H05K 13/04* (2013.01); *H05K 13/046* (2013.01); *H01L 24/02* (2013.01); *H01L 24/05* (2013.01); *H01L 24/27* (2013.01); *H01L 24/30* (2013.01); *H01L 24/32* (2013.01); *H01L 24/82* (2013.01); *H01L 24/92* (2013.01); *H01L 2221/6835* (2013.01); *H01L 2221/68318* (2013.01); *H01L 2221/68322* (2013.01); *H01L 2221/68368* (2013.01); *H01L 2221/68372* (2013.01); *H01L 2221/68381* (2013.01); *H01L 2223/5442* (2013.01); *H01L 2223/54426* (2013.01); *H01L 2223/54486* (2013.01); *H01L 2224/0239* (2013.01); *H01L 2224/02371* (2013.01); *H01L 2224/02372* (2013.01); *H01L 2224/04026* (2013.01); *H01L 2224/056* (2013.01); *H01L 2224/05548* (2013.01); *H01L 2224/08238* (2013.01); *H01L 2224/245* (2013.01); *H01L 2224/24011* (2013.01); *H01L 2224/24137* (2013.01); *H01L 2224/24147* (2013.01); *H01L 2224/24226* (2013.01); *H01L 2224/24998* (2013.01); *H01L 2224/2731* (2013.01); *H01L 2224/291* (2013.01); *H01L 2224/2919* (2013.01); *H01L 2224/2929* (2013.01); *H01L 2224/29078* (2013.01); *H01L 2224/29101* (2013.01); *H01L 2224/29111* (2013.01); *H01L 2224/29344* (2013.01); *H01L 2224/3012* (2013.01); *H01L 2224/32104* (2013.01); *H01L 2224/32146* (2013.01); *H01L 2224/32227* (2013.01); *H01L 2224/73267* (2013.01); *H01L 2224/7598* (2013.01); *H01L 2224/75263* (2013.01); *H01L 2224/75314* (2013.01); *H01L 2224/76155* (2013.01); *H01L 2224/80203* (2013.01); *H01L 2224/80224* (2013.01); *H01L 2224/821* (2013.01); *H01L 2224/82007* (2013.01); *H01L 2224/82102* (2013.01); *H01L 2224/82106* (2013.01); *H01L 2224/8384* (2013.01); *H01L 2224/83093* (2013.01); *H01L 2224/83121* (2013.01); *H01L 2224/83132* (2013.01); *H01L 2224/83191* (2013.01); *H01L 2224/83192* (2013.01); *H01L 2224/83224* (2013.01); *H01L 2224/83805* (2013.01); *H01L 2224/83815* (2013.01); *H01L 2224/83851* (2013.01); *H01L 2224/83855* (2013.01); *H01L 2224/83859* (2013.01); *H01L 2224/83862* (2013.01); *H01L 2224/83868* (2013.01); *H01L 2224/83871* (2013.01); *H01L 2224/83874* (2013.01); *H01L 2224/92244* (2013.01); *H01L 2224/9512* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01023* (2013.01); *H01L 2924/01029* (2013.01); *H01L 2924/01032* (2013.01); *H01L 2924/0132* (2013.01); *H01L 2924/01033* (2013.01); *H01L 2924/0133* (2013.01); *H01L 2924/01047* (2013.01); *H01L 2924/01049* (2013.01); *H01L 2924/01057* (2013.01); *H01L 2924/01075* (2013.01); *H01L 2924/01079* (2013.01); *H01L 2924/01082* (2013.01); *H01L 2924/01322* (2013.01); *H01L 2924/10329* (2013.01); *H01L 2924/12041* (2013.01); *H01L 2924/12044* (2013.01); *H01S 5/02236* (2013.01); *H01S 5/02276* (2013.01); *Y02E 10/50* (2013.01); *Y10T 29/49124* (2015.01); *Y10T 29/51* (2015.01)

(56) References Cited

U.S. PATENT DOCUMENTS

| | | | |
|---|---|---|---|
| 2004/0227886 | A1 | 11/2004 | Kimura |
| 2007/0032089 | A1 | 2/2007 | Nuzzo et al. |
| 2007/0037318 | A1 | 2/2007 | Kim |
| 2007/0254455 | A1 | 11/2007 | Yamaguchi et al. |
| 2008/0268571 | A1 | 10/2008 | Kim |

FOREIGN PATENT DOCUMENTS

| | | | |
|---|---|---|---|
| WO | WO 2008143635 | A1 | 11/2008 |
| WO | WO 2011/126726 | A1 | 10/2011 |

OTHER PUBLICATIONS

International Search Report and Written Opinion Corresponding to International Application No. PCT/US2011/029365; Date of Mailing: Sep. 20, 2011; 19 pages.

Invitation to Pay Additional Fees Corresponding to International Application No. PCT/US2013/021686; Date of Mailing: Apr. 18, 2013; 6 Pages.

International Preliminary Report on Patentability for PCT/US2013/021686 mailed Jul. 31, 2014.

* cited by examiner

LASER ASSISTED TRANSFER WELDING PROCESS

CROSS-REFERENCE TO RELATED APPLICATION

This continuation-in-part application is a 35 USC §111(a) application claiming priority under 35 USC §119 and §120 from International Patent Application No. PCT/US2011/029365 entitled "Electrically Bonded Arrays Of Transfer Printed Active Components" filed on Mar. 22, 2011, which claims priority from U.S. Provisional Patent Application No. 61/318,522 filed on Mar. 29, 2010, the disclosures of which are incorporated by reference herein as if set forth in their entireties.

FIELD

This invention is in the general field of wafer scale semiconductor processing and packaging solutions. More specifically, this invention pertains to the parallel assembly of an ultra-thin die array that is released from a source wafer and then selectively bonded onto a target substrate.

BACKGROUND

Transfer printing processes typically rely on the use of kinetic or shear assisted control of adhesion of transfer stamps to transfer arrays of ultra-thin semiconductor dies onto target substrates, which are typically coated with polymeric adhesive layers. When the surface of the target substrate is relatively smooth, as with polished semiconductor wafers or ultra-flat glass substrates, high transfer printing yields can be achieved without an adhesive layer. However, when the roughness of the target substrate is too high to permit high transfer yields, or too high to provide for the formation of a reliable chemically bonded interface, polymeric adhesive layers can be used.

However, the typically low thermal transport and high coefficient of thermal expansion properties of polymeric adhesive layers can limit the performance or long term reliability of certain classes of semiconductor transfer-printable devices, such as solar cells, light emitting diodes, laser diodes, transistors, and/or integrated circuits. In addition, the electrical insulation properties of polymeric adhesive layers may not permit the formation of electrical contacts at the bonded interface. Thus, further processing steps are typically necessary to deposit and pattern metal interconnection lines over the surface of transfer printed semiconductor dies. Such further processing steps can require special engineering designs, special material logistics and further production setups, stringent quality controls, and/or additional costs.

SUMMARY

Embodiments of the present invention provide methods and systems for transfer welding semiconductor dies. In particular, embodiments of the invention employ transfer printing technologies to release an array of ultra-thin semiconductor dies from a source wafer using a transfer stamp, and metal eutectic layers to adhere those ultra-thin dies onto a surface of a target substrate. Once populated with an array of ultra-thin semiconductor dies, the transfer stamp is aligned and brought into contact with the surface of the target substrate. Patterned electromagnetic radiation, such as a high power laser beam, is focused onto each semiconductor die through a transparent portion of the transfer stamp, to selectively reflow the eutectic layers and bond the semiconductor dies onto the top surface of the target substrate.

The invention thus provides a solution for thermally bonding and interconnecting ultra-thin semiconductor dies, such as solar cells, LEDs, LASERs, integrated circuits, and high power transistors, onto the surface of rigid or flexible substrates. Some embodiments allow for electrically interconnecting electronic devices that have multiple electrical terminals. Some embodiments also provide solutions for transferring ultra-thin semiconductor dies onto rough substrates, such as unpolished ceramic substrates, unpolished polysilicon substrates, unpolished metal substrates, printed circuit boards and/or plastic substrates, with self-planarizing eutectic layers capable of filling micron-size voids.

According to some embodiments of the present invention, a method of printing transferable components includes pressing a stamp including at least one transferable semiconductor component thereon on a target substrate such that the at least one transferable component and a surface of the target substrate contact opposite surfaces of a conductive eutectic layer. During pressing of the stamp on the target substrate, the at least one transferable component is exposed to electromagnetic radiation that is directed through the transfer stamp to reflow the eutectic layer. Then, the stamp is separated from the target substrate to delaminate the at least one transferable component from the stamp and print the at least one transferable component onto the surface of the target substrate.

In some embodiments, the stamp may include a transparent portion that is at least partially aligned with the at least one transferable component in plan view, and the at least one transferable component may be exposed to the electromagnetic radiation through the transparent portion of the stamp.

In some embodiments, the electromagnetic radiation may be laser radiation provided from a light source. For example, the laser radiation may heat the at least one transferable component, and the at least one transferable component may laterally spreads the heat over a surface thereof to reflow the eutectic layer. In other embodiments, a bandgap of the at least one transferable semiconductor component may be transparent to a wavelength of the laser radiation, and the laser radiation may directly heat the eutectic layer to reflow the eutectic layer.

In some embodiments, the surface of the target substrate may be a rough surface, and the eutectic layer may provide a substantially planar interface with the at least one transferable component after the reflow thereof. For example, the target substrate may be an unpolished ceramic substrate, an unpolished polysilicon substrate, an unpolished metal substrate, a printed circuit board, and/or a plastic substrate.

In some embodiments, the at least one transferable semiconductor component may be a plurality of transferable semiconductor components on the stamp. Ones of the plurality of transferable components may be selectively exposed to the patterned electromagnetic radiation through the stamp to reflow portions of the eutectic layer in contact therewith out reflowing other portions of the eutectic layer, and the stamp may be separated from the target substrate to selectively delaminate the ones of the plurality of transferable components from the stamp without delaminating remaining ones of the plurality of transferable components.

In some embodiments, the plurality of transferable components may define a continuous array of transferable components. Prior to pressing the stamp with the target substrate, the stamp may be contacted with a source substrate including the array of transferable components thereon, and the stamp may be retracted from the source substrate to transfer the array of transferable components to the stamp. The ones of the plurality of transferable components that are delaminated from the stamp may be a subset of the array.

In some embodiments, the eutectic layer may be a multi-layer stack including at least two different layers.

In some embodiments, the eutectic layer may include a first eutectic stack adjacent edge portions of the at least one transferable component, and a second eutectic stack between the edge portions. The edge portions of the at least one transferable component may be selectively exposed to the patterned electromagnetic radiation to reflow the first eutectic stack without reflowing the second eutectic stack.

In some embodiments, the first eutectic stack may be a material having a higher melting temperature than the second eutectic stack. The target substrate may be heated at a temperature sufficient to selectively reflow the second eutectic stack without reflowing the first eutectic stack. The second eutectic stack may provide an ohmic contact to the at least one transferable component.

In some embodiments, the first eutectic stack may include a metal alloy, and the second eutectic stack may include a metal-semiconductor alloy.

In some embodiments, the at least one transferable component may include a first multi-junction solar cell stacked on a second multi-junction solar cell having a lower bandgap than the first multi-junction solar cell, and an interface between the first and second solar cells may include a eutectic material.

In some embodiments, the interface may further include at least one metal finger protruding from a recess in the second multi-junction solar cell, and the at least one metal finger may include the eutectic material thereon.

In some embodiments, an intrinsically doped layer or a P-N diode structure may be provided along the interface between the first and second multi-junction solar cells, and a doped lateral current spreading layer may be provided on the intrinsically doped layer or P-N diode structure opposite the second solar cell.

In some embodiments, the at least one transferable component printed on the target substrate may be identified as defective, and the stamp may be contacted with the at least one transferable component responsive to identifying that the at least one transferable component is defective. The at least one transferable component may be exposed to second patterned electromagnetic radiation that is directed through the stamp to reflow the eutectic layer, and then the stamp including the at least one transferable component thereon may be retracted from the target substrate while the eutectic layer is reflowed to delaminate the at least one transferable component from the target substrate.

In some embodiments, the eutectic layer may provide an electrical connection between the at least one transferable component and a metal interconnection line on the target substrate.

In some embodiments, the at least one transferable component may include one or more metal finger layers protruding from a surface thereof, and the eutectic layer may be on the metal finger layers.

In some embodiments, patterning a metal layer on the target substrate may be patterned to define the metal interconnect line and a local alignment mark, and the stamp may be aligned with the local alignment mark on the target substrate prior to pressing the stamp on the target substrate.

In some embodiments, the at least one transferable component may be a solar cell, light emitting diode, laser diode, or transistor.

According to further embodiments of the present invention, a system for fabricating an array of printable components includes a stamp having at least one printable semiconductor component on a transfer surface thereof, a transfer printing tool head including the stamp mounted thereon, and a controller coupled to the transfer printing tool head. The controller is configured to operate the transfer printing tool head to press the stamp on a target substrate such that the at least one printable component contacts the surface of the target substrate, where the at least one printable component and/or the surface of the target substrate include a conductive eutectic layer thereon. An electromagnetic radiation source is configured to expose the at least one printable component to electromagnetic radiation directed through the transfer stamp to reflow the eutectic layer when the stamp is pressed on the target substrate. The controller is configured to operate the transfer printing tool head to separate the stamp from the target substrate after the reflow of the eutectic layer to delaminate the at least one printable component from the stamp and transfer the at least one printable component onto the surface of the target substrate.

In further detail, a transfer stamp is used to pick up a continuous or sparse array of ultra-thin semiconductor dies from the surface of source wafer. Eutectic layers are deposited and in some embodiments patterned onto the surface of a target substrate. The transfer stamp is then laminated onto the target substrate, bringing the array of semiconductor dies into intimate contact with the surface of the eutectic layers. Each semiconductor die is then temporary heated with a high power electromagnetic radiation (which may be provided by a focused laser beam), causing the eutectic layers in direct physical contact with the semiconductor die to melt.

In some embodiments of the invention, eutectic layers are deposited onto the surface of a target substrate. In other embodiments of the invention, eutectic layers are deposited on the top surface of the dies on the source wafer. In still other embodiments of the invention, the eutectic layers are patterned into multiple bonding lines/pads using standard microprocessing patterning techniques known in the art, such as photolithography patterning techniques and etch back or metal lift-off processes.

In further embodiments, the compositions of the eutectic layers are selected and/or optimized to enable the formation of an ohmic contact to the back surface of the semiconductor dies. In additional embodiments of the invention, the eutectic layers form a low resistance ohmic contact between one or multiple electrodes of the semiconductor dies and one or multiple interconnection pads defined on the surface of the target substrate.

The various embodiments of the invention may have common elements and may be variants of processes that employ transfer printing to release an array of ultra-thin semiconductor dies from a source wafer using a transfer stamp, and metal eutectic layers to align and adhere those ultra-thin dies onto the surface of target substrates. In particular embodiments, a high power laser beam is focused onto each semiconductor die through a transparent portion of the transfer stamp, to selectively reflow the eutectic layers and bond the semiconductor dies onto the top surface of the target substrate.

The eutectic layers allow for improved dissipation of heat from the semiconductor dies to the target substrate. In some embodiments of the invention, the eutectic layers are deposited and patterned into recessed features to permit the formation of high optical quality semiconductor-to-semiconductor bonded interfaces. These embodiments of the invention can enable the heterogeneous integration of non-lattice matched high-bandgap and low-bandgap solar cells, which can be grown on separate epitaxial substrates. In other embodiments of the invention, the composition of the eutectic stack may be selected and/or optimized to enable multiple reflow steps, permitting selective removal and replacement of defective dies.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTIONS OF EMBODIMENTS

Figure 1A:
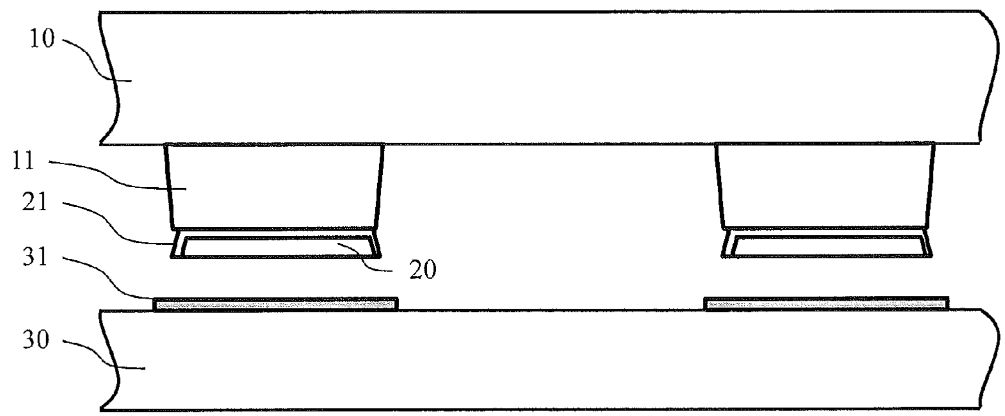
FIGS. 1*a-c* present a schematic illustration of a transfer welding process according to some embodiments of the invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a component, layer, region or substrate is referred to as being "on" or extending "onto" or "contacting" another element, it can be directly on or extend directly onto or be in direct contact with the other element, or intervening elements may also be present. In contrast, when an element is referred to as being "directly on" or extending "directly onto" or "directly contacting" another element, there are no intervening elements present. It will also be understood that when an element is referred to as being "in contact with" or "connected to" or "coupled to" another element, it can be directly contacting or connected to or coupled to the other element or intervening elements may be present. In contrast, when an element is referred to as being "in direct contact with" or "directly connected to" or "directly coupled to" another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In other words, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Figure 1B:
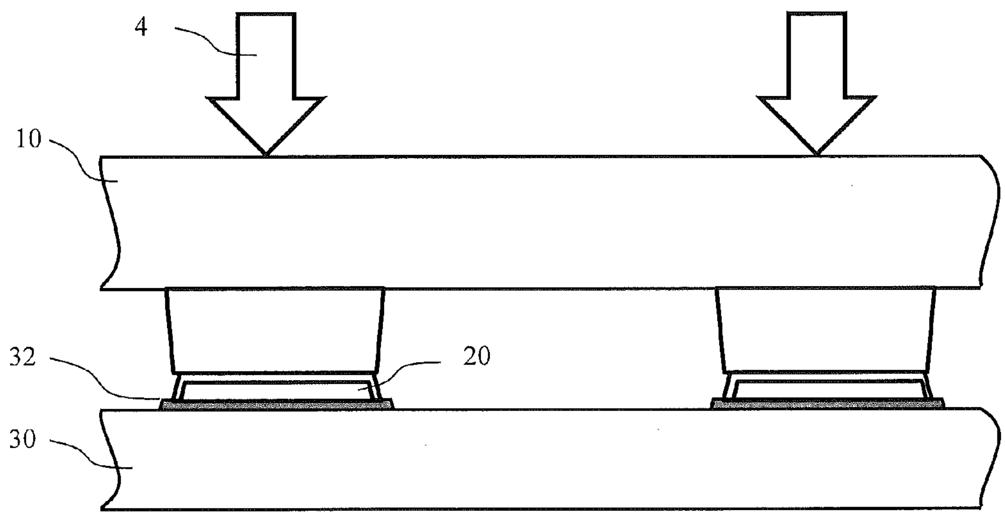
Figure 1C:
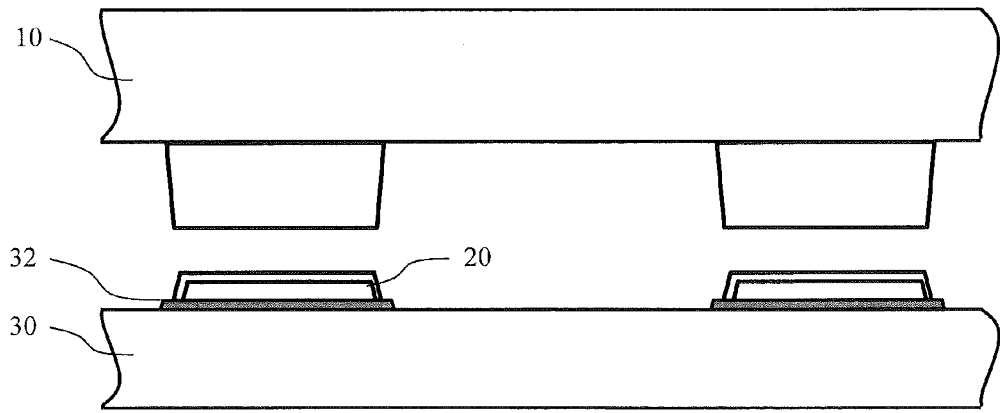

Referring now to the drawings, FIG. 1*a-c* present a schematic illustration of a transfer welding process in accordance with some embodiments of the invention. As used herein, the terms “welding” or “transfer welding” may generally refer to the joining of a transferable component with another component, layer, or substrate. In particular, in FIG. 1*a*, a transfer stamp 10 is used to selectively pickup an array of active transferable electronic components (illustrated as ultra-thin semiconductor dies 20) onto respective surfaces of raised post features 11 that protrude from a surface of the stamp 10. The transfer stamp 10 may be mounted to a transfer printing tool head, and a controller may be coupled to the transfer printing tool head to control one or more of the operations described herein. A single or multi-layer electrically conductive eutectic material (illustrated as eutectic stack 31) is deposited onto the surface of a destination substrate or target substrate 30. In FIG. 1*b*, the transfer stamp 10 is laminated onto the target substrate 30, bringing the array of semiconductor dies 20 into contact with the surface of the eutectic stack 31. Each semiconductor die 20 is temporarily heated using electromagnetic radiation provided by a light source (illustrated as a high power laser light beam 4), causing one or more of the eutectic layers 31 in physical contact with the semiconductor die to melt. As used herein, the electromagnetic radiation 4 is provided with a strength and duration that is sufficient to reflow the eutectic layer(s) 31, and includes electromagnetic radiation of any frequency, such as that provided by infrared lasers, ultraviolet lasers, etc., and thus is not limited to visible light. The stamp 10 (and one or more of the post features 11 protruding therefrom) may include one or more transparent layers or portions through with the laser light 4 may be transmitted. The transparent portion(s) of the stamp 10 may be aligned with the dies 20 in plan view. In this embodiment, each semiconductor die 20 itself is used as a lateral heat spreader. If the laser beam intensity profile is not perfectly uniform, laterally spreading the heat into the semiconductor die can be used as an effective way to improve the uniformity of the heat flux transferred to the eutectic layer(s) 31. In further embodiments, the wavelength of the laser can be selected to be longer than the semiconductor bandgaps. In such an embodiment, the semiconductor dies 20 are transparent to the laser beam 4, and thus the eutectic stack 31 can be directly heated by the laser beam 4.

As shown in FIG. 1*b*, an external pressure can be applied to the back of the transfer stamp 10 (e.g., the surface of the stamp 10 opposite the surface from which the posts 11 protrude) during the course of the laser welding process. This external pressure is transferred by the stamp 10 to the semiconductor dies 20, which can improve the quality of the final bonded interface between the dies 20 and the eutectic layer 31 as the liquid eutectic layer stack 31 flows and wets the back surface of the semiconductor dies 20. In FIG. 1*c*, after the semiconductor dies 20 are bonded to the target substrate 30, the stamp 10 is moved away from the target substrate 30 to deposit or “print” the dies 20 onto the target substrate 30.

Figure 2A:
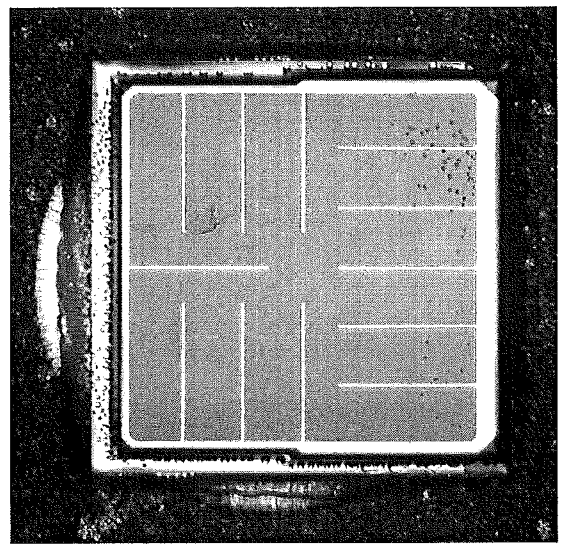
FIGS. 2*a-c* present experimental results in accordance with some embodiments of the invention. The results validate effectiveness of embodiments of the invention in the case of semiconductor dies consisting of triple junction solar cells.
Figure 2B:
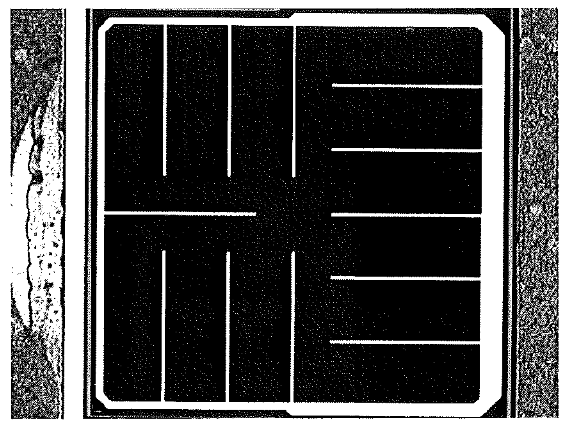
Figure 2C:
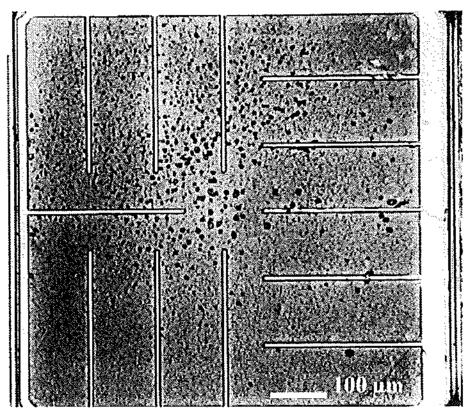

FIGS. 2*a-c* present experimental results achieved according to some embodiments of the invention. The experimental results validated the effectiveness of some embodiments described herein in the case where the semiconductor dies include triple junction solar cells. In particular, a concentrator solar cell was laser transfer-welded onto the surface of an as fired (i.e. rough) ceramic substrate using an Indium-Gold based eutectic stack. A beam provided by a fiber coupled 808-nm solid state diode laser was precisely aligned and focused onto the surface of the triple junction solar cell to reflow the eutectic stack. The diameter of the laser beam spot was slightly smaller than the active area (650×650 um) of the solar cell. In this configuration, the laser beam light was absorbed by the solar cell, which thus acted as a heat spreader to indirectly transfer heat and melt the Indium/Gold eutectic stack. The transfer stamp included a transparent silicone (polydimethylsiloxane (PDMS)) layer molded against a glass backing. The eutectic stack included a multilayer stack including four periods of alternating 100 nm-thick Indium and 5 nm-thick Gold layers. The layers of the eutectic stack were deposited by thermal evaporation with four repeats. The total thickness of the eutectic stack was thus approximately 420 nm. A 500 ms long laser pulse at a laser current bias of 7A was sufficient to successfully melt the eutectic layers and bond the solar cell to the ceramic substrate.

FIGS. 2*a* and 2*b* respectively present high resolution optical images of a triple junction cell laser welded onto the surface of an unpolished ceramic substrate prior to (FIG. 2*a*) and after (FIG. 2*b*) removal of the solar cell photoresist layer encapsulation layer. FIG. 2*c* presents a high resolution near-infra red optical image of the bonded interface between the solar cell and the eutectic stack as captured using an InGaAs camera. This inspection camera is an effective method to visually inspect and assess the quality of the bonded interface. The micro-sized voids visible in this image are due to the high surface roughness of the as fired ceramic substrate. In this experiment, the total thickness of the eutectic layers (420 nm) was lower than the peak-to-valley roughness of this substrate (~1,200 nm). The transfer welded solar cells pass a standard (Scotch®) tape peel test, confirming the good mechanical strength of the bonded interface.

Figure 3:
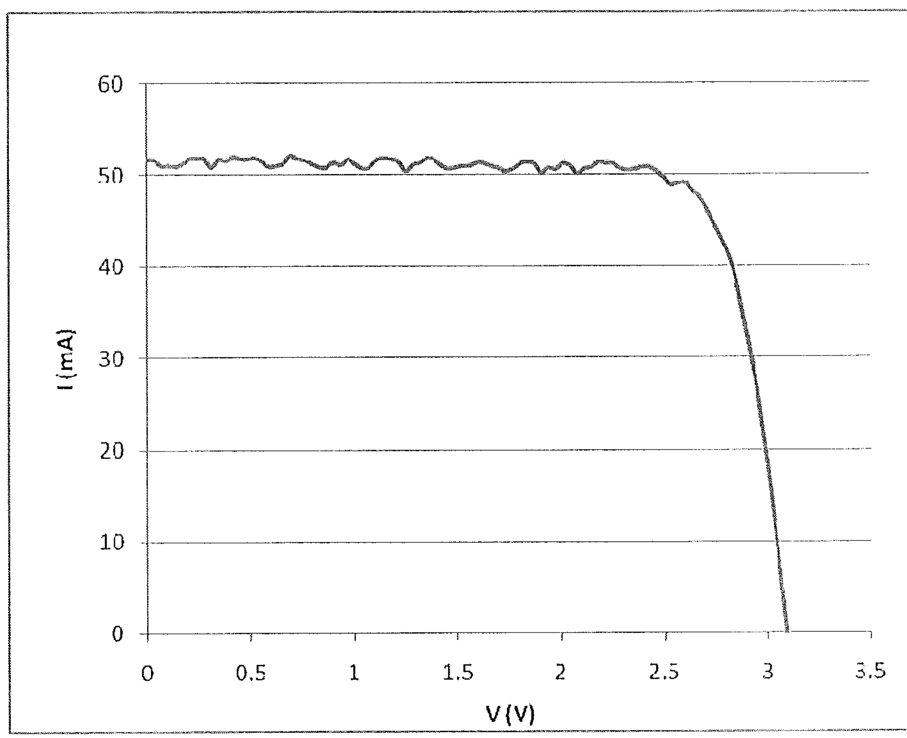
FIG. 3 presents current-voltage characteristics of the bonded triple junction solar cell of FIGS. 2*a-c* under concentrated light.

FIG. 3 presents current-voltage characteristics of the bonded triple junction solar cell shown in FIGS. 2*a-c* under concentrated light. These electrical test results confirm that the laser welding process does not significantly adversely affect the performance of the transferred solar cell.

Figure 4A:
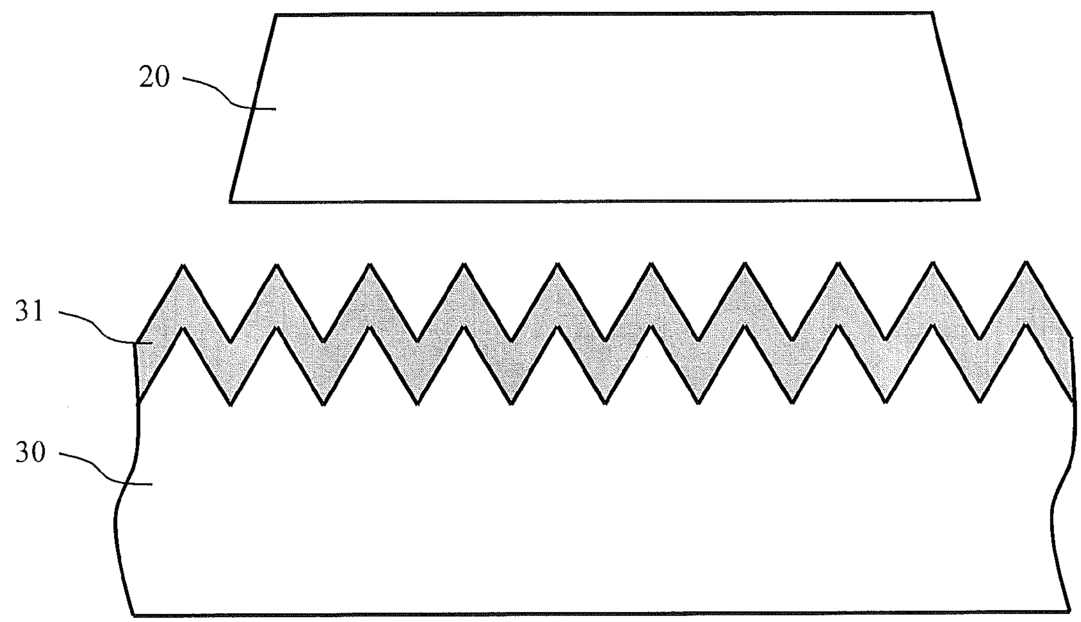
FIGS. 4*a-b* illustrate methods of transfer welding ultra-thin semiconductor dies onto rough target substrates when eutectic layers are reflowed under low compression forces according to some embodiments of the present invention.
Figure 4B:
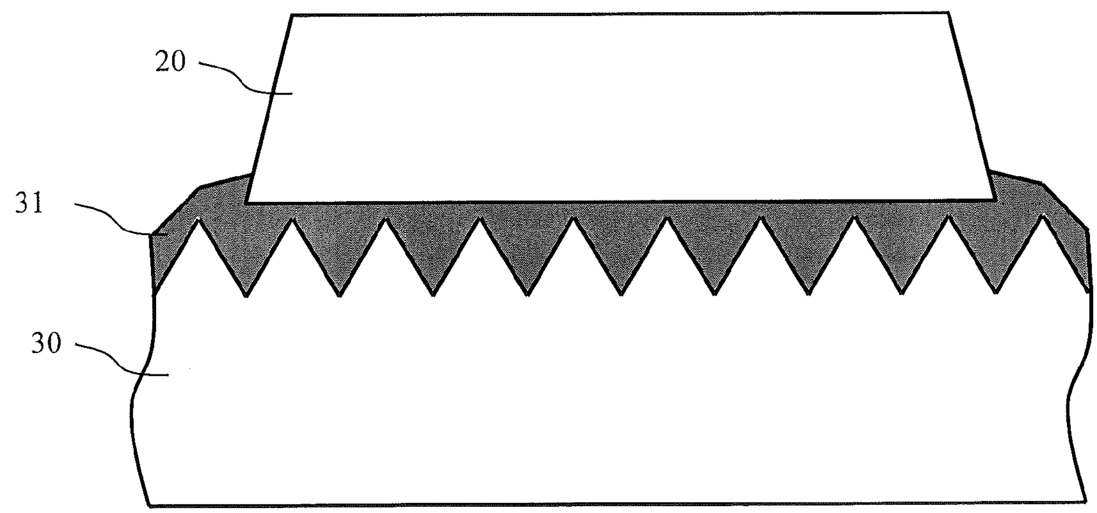

FIGS. 4*a-b* schematically illustrate the use of electrically conductive eutectic layers for transfer welding according to embodiments of the present invention. In particular, as shown in FIG. 4*a*, a eutectic layer 31 is deposited on a rough surface of a target substrate 30 prior to contact with a semiconductor die 20. The eutectic layer 31 can be reflowed under low compression forces (<10 PSI) to provide a substantially planar surface to which the die 20 is bonded. More particularly, as shown in FIG. 4*b*, the melted eutectic layers planarize the rough surface of the target substrate and conform to the back surface of the semiconductor die 20.

Figure 5:
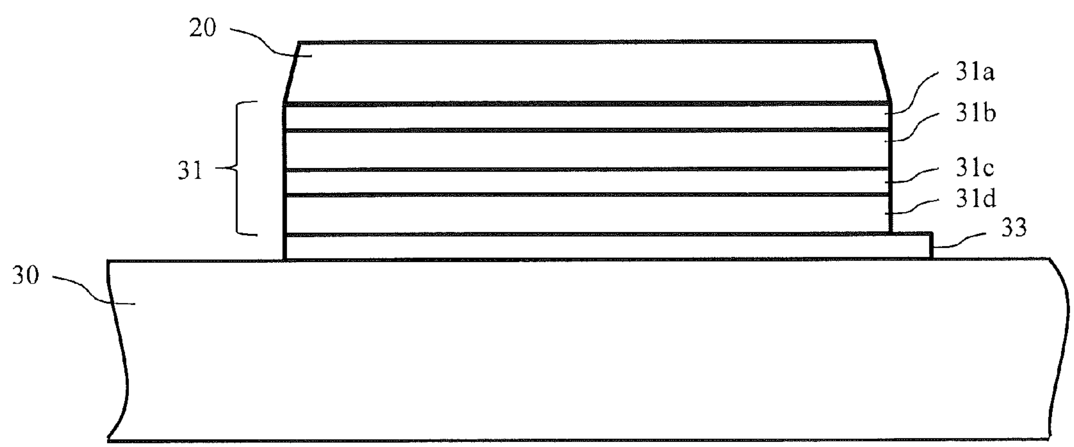
FIG. 5 illustrates a multilayer eutectic stack according to some embodiments of the present invention deposited and patterned on-top of a metal interconnect line to enable the formation of an electrical connection to the back side of a semiconductor die.

FIG. 5 schematically illustrates a multilayer eutectic stack 31 deposited and patterned on a metal interconnect line 33 to enable the formation of an electrical connection to the back side of a semiconductor die 20. The multilayer eutectic stack 31 includes capping layers 31, eutectic layers 31*b-c*, and diffusion barrier layers 31*d*. The composition and/or thickness of capping layers 31*a*, eutectic layers 31*b-c*, and diffusion barrier layers 31*d* can be selected and/or optimized to enable the formation of a low resistance ohmic metal-semiconductor contact upon reflow. In some embodiments, the laser welding process described herein can be performed under an inert or reducing gas environment to prevent oxidation.

Figure 6A:
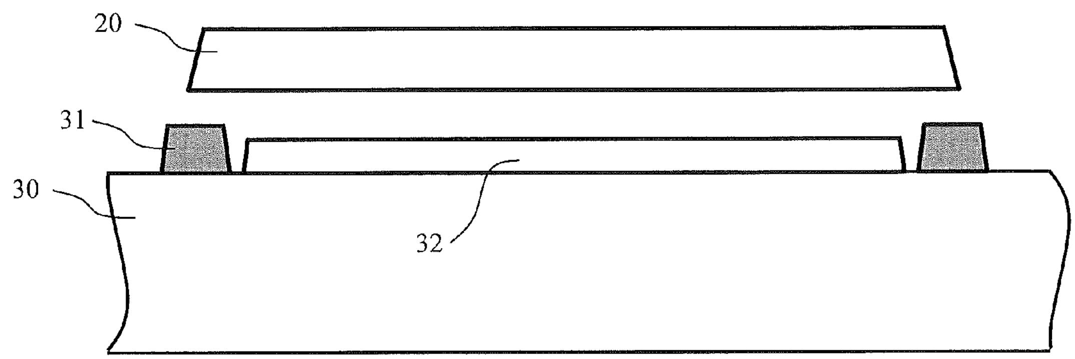
FIGS. 6*a-c* present methods of transfer welding according to further embodiments of the present invention relying on the use of two eutectic stacks.
Figure 6B:
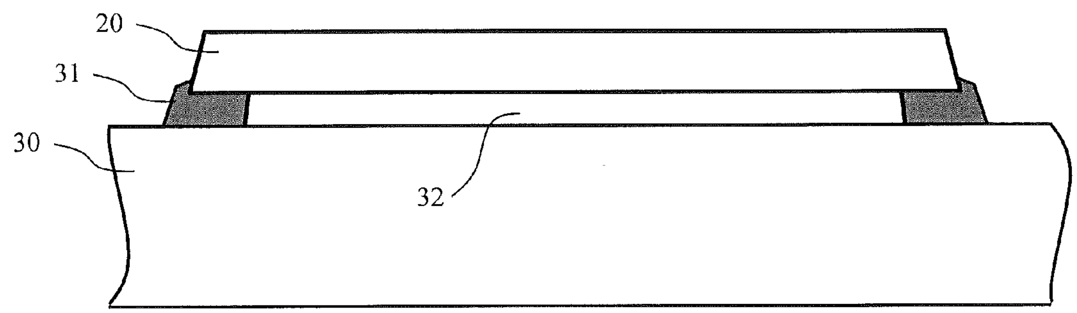
Figure 6C:
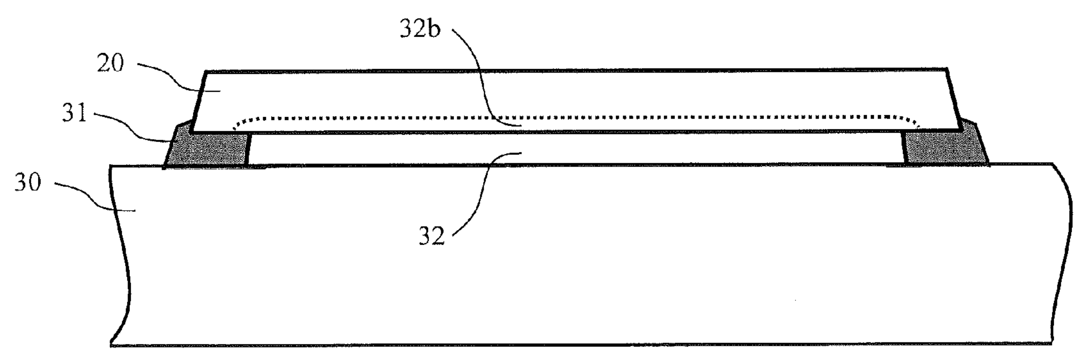

FIGS. 6*a-c* present a transfer welding process according to further embodiments that relies on the use of two eutectic stacks of differing composition. As shown in FIGS. 6*a-c*, a lower temperature first eutectic stack 31 is patterned or otherwise configured to bond to edge portions of the semiconductor die 20, and a higher temperature second eutectic stack 32 is patterned or otherwise configured to bond to the bottom surface of the semiconductor die 20. The first eutectic stack 31 may be formed of one or more eutectic layers which, after reflow, may be converted to an alloy having a higher melting temperature than a formation temperature of the second eutectic stack 32. For example, in some embodiments, the first eutectic stack 31 may include one or more metals and/or alloys thereof, while the second eutectic stack 32 may include semiconductors, metals, and/or alloys thereof. As such, a laser transfer welding process as described herein can be used to selectively reflow the first eutectic stack 31 without reflowing the second eutectic stack 32. In particular, a focused laser beam can be adjusted to selectively melt the first metal eutectic stack 31 at about the formation temperature of the first eutectic stack 31. After completion of the transfer welding process, the entire target substrate 30 can be uniformly heated inside a reflow oven at about the formation temperature of the second semiconductor-metal eutectic stack 32 to form an alloyed ohmic contact 32*b* at the bottom surface of the semiconductor die 20.

In some embodiments, the composition of the metal eutectic 31 may be selected to have a formation temperature lower than the formation temperature of the semiconductor-metal eutectic 32, and the melting temperature of the formed metal eutectic alloy 31 may be higher than the formation temperature of the semiconductor-metal eutectic 32. For example, the first eutectic stack 31 may include In—Au metal alloys, while the second eutectic stack 32 may include Au—Ge alloys, which are typically used to form ohmic contacts to GaAs semiconductor. In this specific case, the formation of In—Au alloys of the first eutectic stack 31 can be initiated at temperatures as low as about 157° C., and the melting temperature of formed In—Au alloys having indium weight percent composition in the 28 to 78% range (by weight) are higher than about 454° C. As the melting temperature of these In—Au alloys is higher than the anneal temperature of the Au—Ge (356° C. eutectic) contacts provided by the second eutectic stack 32 on the GaAs semiconductor, the formed In—Au alloys of the first eutectic stack 31 remain solid (e.g., are not reflowed) during a second reflow at temperatures in the range of about 360-450° C. (e.g., a temperature sufficient to reflow the second eutectic stack 32). This second reflow process can be performed under a vacuum to reduce the likelihood of trapping air pockets at the metal-semiconductor interface. The composition of the second metal eutectic 32 and/or doping of the semiconductor material can be selected and/or optimized to permit the formation of a low resistance ohmic electrical contact using standard practices.

Figure 7A:
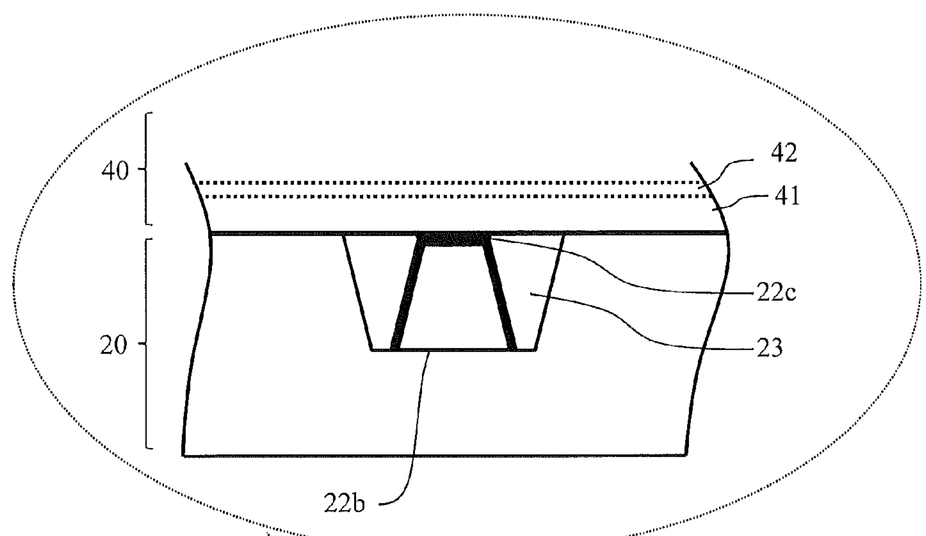
FIGS. 7*a-b* present example embodiments of the invention enabling heterogeneous integration of high band-gap multi-junction solar cells onto low bandgap multi-junction solar cells, which can be grown onto separate source substrates.
Figure 7B:
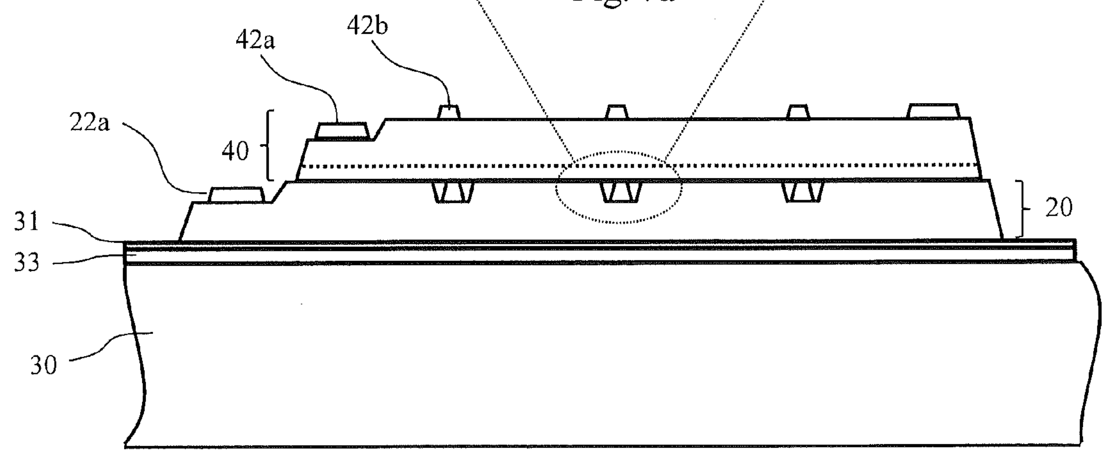

FIGS. 7*a-b* present embodiments of the invention that enable heterogeneous integration of high bandgap multi-junction solar cells (such as InGaP/GaAs 40) onto low bandgap multi-junction solar cells (such as InGaAsP/InGaAs 20), also referred to herein as a dual or tandem solar cell structure. The high bandgap and low bandgap multi-junction solar cells can be grown on separate source substrates. In this embodiment, a eutectic stack 22*c* and current collection metal grid fingers 22*b* can be deposited and patterned into cavities 23 etched into the low bandgap epitaxially grown semiconductor layers 20. In some embodiments, the lateral dimensions and spacing/positioning of the metal grid fingers are selected and/or optimized to reduce or minimize shadow losses when the cell structure is exposed to solar radiation. The total thickness of the grid metal and eutectic stack is selected and/or optimized to permit direct contact between the backside or lower surface of the high bandgap solar cell 40 and the top or upper surface of the low bandgap solar cell 20 after completion of the laser soldering process.

In a subsequent step, the structure can be further annealed to initiate the formation of chemical bonds (such as hydrogen bonds) between the two solar cells 40 and 20. In such embodiments, a high optical quality (low shadow losses) and high thermal performance (direct semiconductor to semiconductor contact) interface between the solar cells 40 and 20 may be formed at low temperatures, which may allow for fabrication of ultra-high performance heterogeneously integrated multi-junction solar cells. Heterogeneous integration of InGaP/GaAs tandem solar cells 40 with InGaAsP/InGaAs tandem solar cells 20 can enable the fabrication of stacked solar cell structures capable of achieving greater than about 45% conversion efficiency under high optical concentration ratio.

The typically poor electrical resistance (≥0.3 Ω·cm2) of wafer bonded stacked 4J or 5J solar cells structures reported, for example, in the article "Directed semiconductor bonding technology (SBT) for high efficiency IIV multi-junction solar cells", Bhusari D. et al., IEEE PVSC 2011, may not permit efficient operation of such cells under high concentration ratios (i.e. >500 suns). In this article, the low and high bandgap solar cells were grown on separate substrates, thus reducing or eliminating lattice match growth constraints typically encountered in upfront monolithic growth approaches.

In contrast to such wafer bonding processes, the herein disclosed eutectic bonded structure does not require the bonded semiconductor surfaces to be planarized down to the sub-nanometer level in order to achieve high bonding yield. The thickness, geometry, and/or depth of the metal grid fingers 22*b*, eutectic stack 22*c*, and etched cavities 23 can be selected and/or optimized to make the bonding process tolerant to surface roughness, which may be present on the top surface of the as-grown low bandgap solar cell 20. Unlike some other wafer bonding processes, the herein disclosed eutectic bonded structure does not require the top cell to be grown inverted.

The herein disclosed dual or tandem 4 terminal solar cell structure can also offer additional performance advantages over wafer bonded structures, as the current generated by the top high bandgap cell 40 of the tandem cell can be independently extracted and thus does not have to be matched to the current generated by the bottom low bandgap cell 20 of the tandem cell. Such eutectic bonded structures may thus at least partially alleviate current matching constraints typically encountered in series connected monolithic solar cells.

In the case of a InP-based low bandgap solar cell, the tandem cell can be released from a higher-cost InP growth substrate and transfer welded onto the surface of a lower-cost target substrate 30, in order to permit re-use of the higher-cost InP growth substrates. Such wafer re-use process has been demonstrated for the case of InGaP/GaAs tandem solar cells grown on GaAs substrates. In some embodiments, the low bandgap cell 20 can be transfer welded onto the surface of an electrically conducting metal layer 33 to enable the formation of a low resistance (ohmic) back-side contact.

In order to provide electrical insulation between the bottom or lower contact 42*a* of the high bandgap cell 40 and the top or upper contact 22*b* of the low bandgap cell 20, an intrinsically doped layer or a P-N diode structure 41 can be incorporated at the bottom of the high bandgap 40 cell, that is, along the interface between the high bandgap 40 and low bandgap 20 cells. In such case, a highly doped lateral current spreading layer 42 can be incorporated at the bottom of the high bandgap solar cell epi design 40 (e.g., with the layer 41 between the current spreading layer 42 and the low bandgap cell 20) in order to reduce or minimize series resistance and thus permit high performance under high concentration ratios. To reduce or minimize shadow losses, the grid fingers 42*b* of the top high bandgap solar cell 20 can be designed to be precisely aligned (in plan view) with the metal grid fingers 22*b* of the bottom low bandgap solar cell 20. In addition, in order to further improve device performance, the herein disclosed integration approach can be used to heterogeneously integrate triple junction high bandgap solar cells (such as AlGaInP/InGaP/Ga(In)As) onto low bandgap tandem or triple junction low bandgap cells which can be grown on InP or GaSb substrates. The herein disclosed integration approach is also applicable to the heterogeneous integration of high bandgap solar cells onto non-lattice matched (i.e., metamorphic) solar cells, which may be grown on standard Ge or GaAs substrates.

Figure 8A:
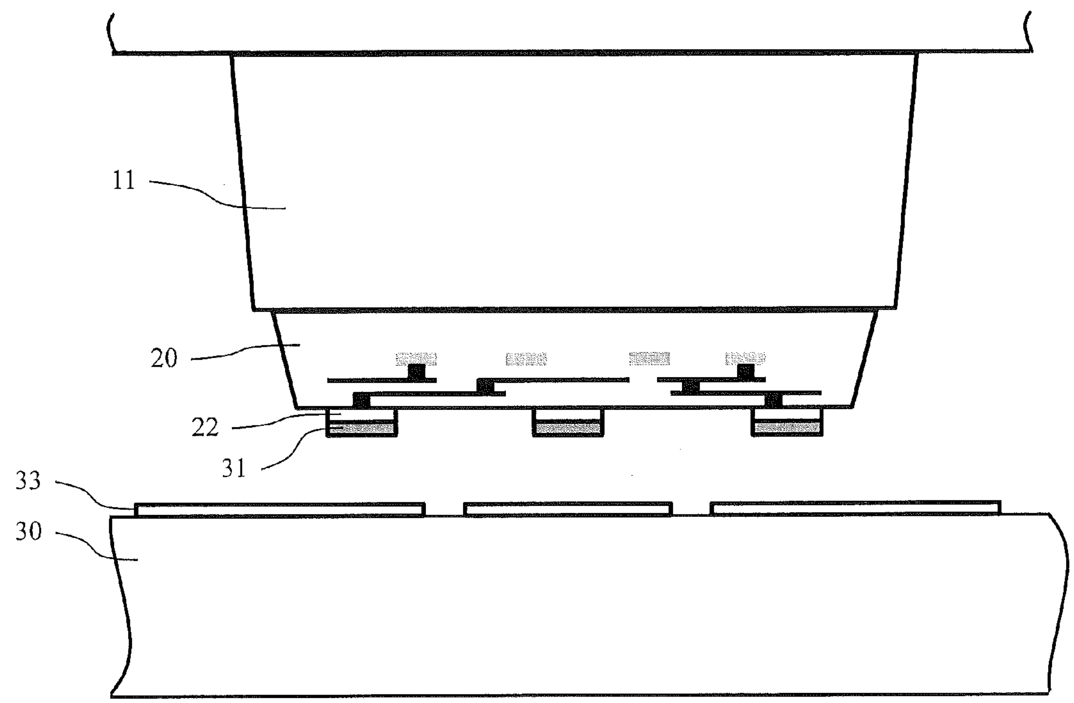
FIGS. 8*a-b* present example embodiments of the invention applied to a multi-terminal semiconductor die, which may contain an integrated circuit, optoelectronic, or power/high frequency device.
Figure 8B:
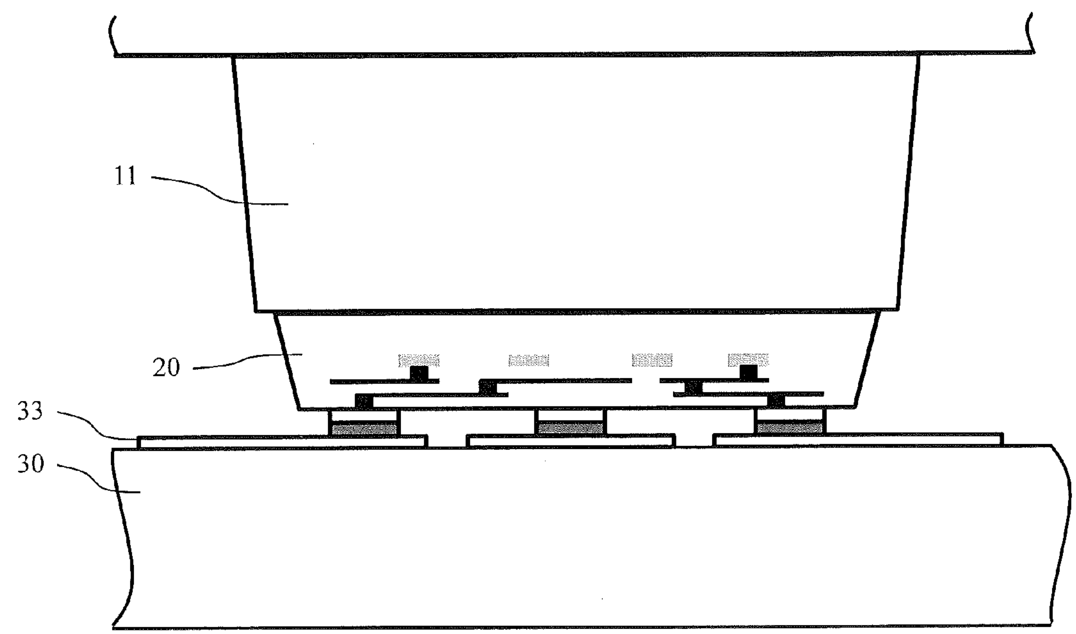

FIGS. 8*a*-*b* present examples of transfer welding processes in accordance with embodiments of the present invention applied to the case of a multi-terminal ultra-thin semiconductor die 20. The multi-terminal die 20 may include an integrated circuit, optoelectronic, or power/high frequency device. The die 20 may include one or more electrical elements (such as transistors, capacitors, resistors, and/or wires) and/or electro-optical elements (such as photo-sensors and/or light-emitting diodes), as well as electrical terminals 22 on a surface of the die 20 that may provide electrical connections to such elements. In such embodiments, the ultra-thin semiconductor die 20 can be presented upside down, i.e. with electrical terminals 22 facing down or opposite to the stamp. In these embodiments, the eutectic stack 31 is deposited and patterned on the surface of the terminals 22 of the semiconductor die 20, and the stamp including the die 20 on the post 11 protruding therefrom is moved toward the target substrate 30 such that the terminals 22 and the eutectic layer 31 thereon are brought into contact with conductive metal traces 33 on the target substrate 30. Upon exposure to electromagnetic radiation (for example, a focused laser beam), reflow of the eutectic stack 31 enables the formation of an array of electrical contacts between the semiconductor die 20 and conductive metal traces 33 defined on the surface of a target substrate 30. After completion of the laser welding process, the stamp is retracted and the transferred die 20 can be electrically tested without further processing.

If defective dies are detected, these dies can be selectively removed from the array using a reversed sequence laser unwelding (rework) process. In particular, a single post of a stamp can be brought into contact with the defective die, the eutectic layer can be reflowed by exposure to electromagnetic radiation (for example, a high power laser pulse), and the stamp can be lifted to retrieve the defective die while the eutectic is melted. In a subsequent step, a new die can be re-soldered to replace the defective die. The composition of the metal eutectic stack can be selected or optimized to permit multiple rework processes to be performed at moderate reflow temperatures ranges. For example, Au—Sn based eutectics may be used over In—Au eutectics as the re-melting temperature of the formed Au—Sn alloys remains below 400° C. for Au—Sn eutectic compositions having a gold weight percent fraction in the 70 to 82% range. Such a rework process may be used for applications, such as displays or digital X-ray detectors, requiring very large arrays (i.e., several thousands) of semiconductor dies to be interconnected onto backplanes with near 100% functional electrical yield. The rework capability of the herein disclosed transfer welding integration approach offers significant advantages over other metal overedge interconnection processes, some of which may require more destructive (i.e., involving removal and re-deposition of dielectric and/or metal layers) rework procedures.

Figure 9A:
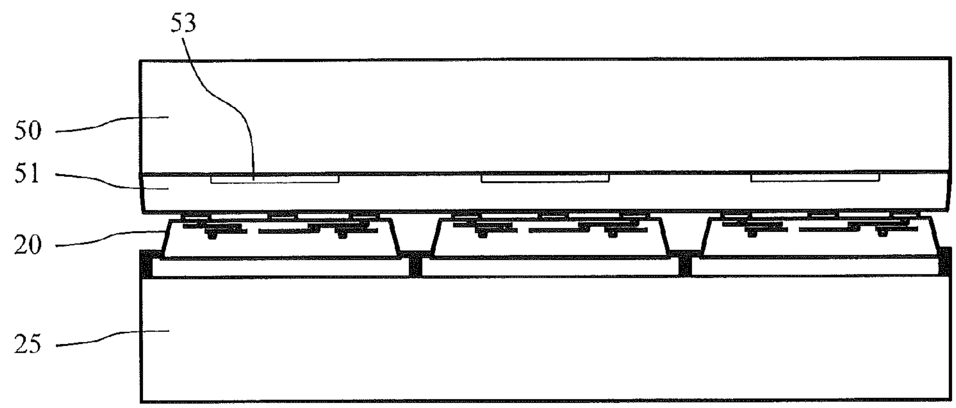
FIGS. 9*a-c* present a double transfer process according to embodiments of the invention in which semiconductor dies are first transferred to a temporary carrier substrate.
Figure 9B:
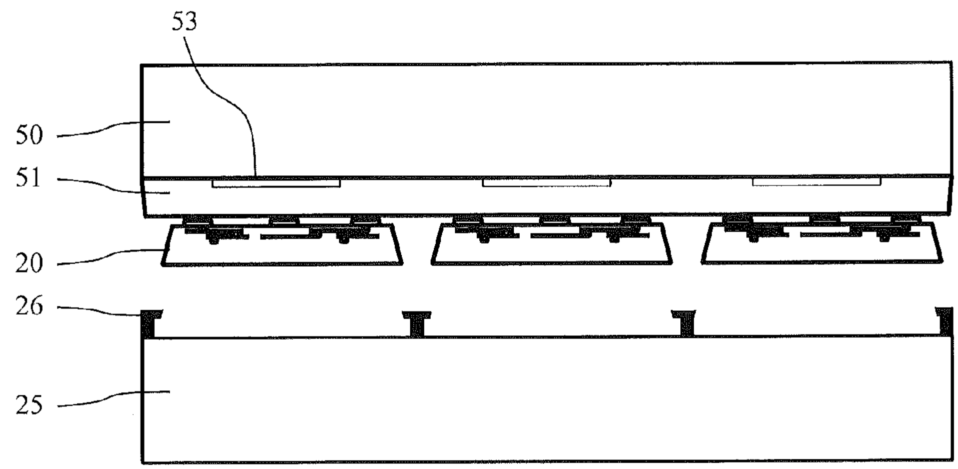
Figure 9C:
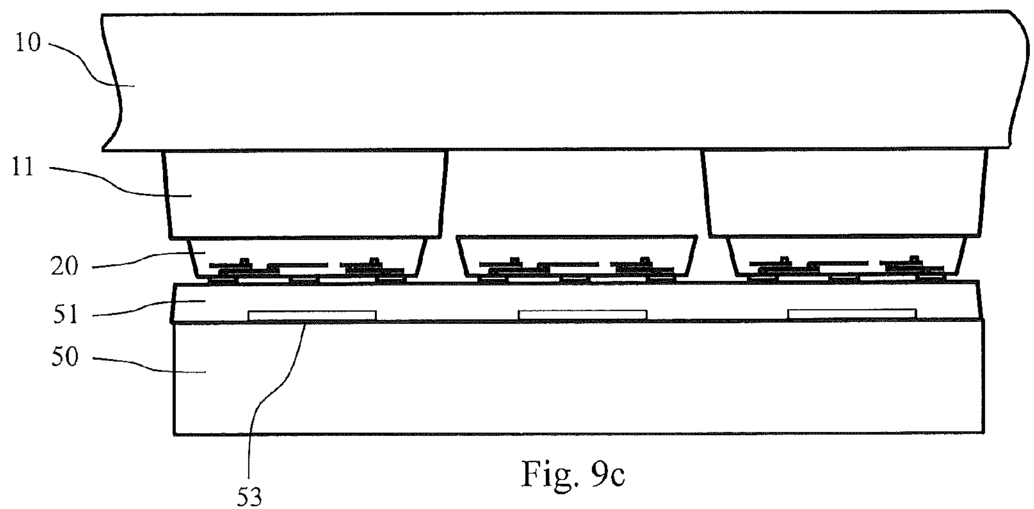

FIGS. 9*a*-*c* present a double transfer process which enables semiconductor dies 20 fabricated using standard micro-fabrication processes to be first transferred to a temporary carrier substrate 50. In particular, as shown in FIG. 9*a*, the temporary carrier substrate 50 is brought into contact with a substrate 25 including the semiconductor dies 20 thereon. The substrate 25 may be a source substrate on which the semiconductor dies 20 were formed. The dies 20 may be anchored or otherwise attached to the substrate 25 by breakable tether structures 26. The breakable tether structures 26 may be electrically conductive in some embodiments. The pressure with which the stamp 10 is brought into contact with the substrate 25 is sufficient to break the tethers 26 anchoring the dies 20 to the substrate 25, and the dies 20 are thereby transferred to the temporary substrate 50 when the stamp 10 is retracted from the substrate 25, as shown in FIG. 9*b*.

The temporary substrate 50 can be loaded onto a transfer printing tool in order to pick-up an array of dies 20 (front face/electrical terminals 22 facing down or toward the temporary substrate 50) using a transfer stamp 10, as shown in FIG. 9*c*. A low tack silicone adhesive layer 51 can be deposited onto the surface of the temporary carrier substrate 50 to facilitate the first transfer step (from the substrate 25 to the carrier substrate 50), and to permit high yield pickup during the second transfer step (from the carrier substrate 50 to the stamp 10). Additionally or alternatively, resistive thin film metal heater elements 53 may be patterned onto the surface of the temporary carrier substrate 50 prior to deposition of the low tack adhesive layer 51. These heater elements 53 may be powered during the second pick-up step of FIG. 9*c* to facilitate retrieval of the semiconductor dies 20 from the temporary carrier substrate 50. In particular, heat induced thermal expansion of the adhesive layer 51 can induce shear stresses, causing delamination at the interface between the semiconductor dies 20 and the adhesive layer 51.

Transfer welding of micro-sized semiconductor dies also allows for integrating large array multi-terminal devices onto large area rigid or flexible substrates. Performing accurate layer to layer patterning steps on plastic substrates can be intrinsically challenging due to the typically poor dimensional stability of most plastic substrates when processed at moderate temperature. Embodiments of the present invention therefore provide an improvement over other methods for interconnecting ultra-thin multi-terminals devices onto large area substrates. For example, metal over-edge interconnection processes typically rely on the following process sequence: 1) in a first step, an array of multi-terminals devices are transfer printed (with terminals facing up) onto the surface of a target substrate; 2) in a second step, an interlayer dielectric is (optionally) deposited and patterned to open contact via areas over each device terminals; and 3) in a third step, a metal layer is deposited and patterned to form electrical interconnects. The alignment registration of patterning steps (2) and (3) can be limited by the dimensional stability of the target substrate, which may thus limit the maximum area which can be patterned in a single exposure step (for a chosen set of critical registration design rules). These and other limitations can be overcome with the transfer welding process according to embodiments described herein.

Figure 10:
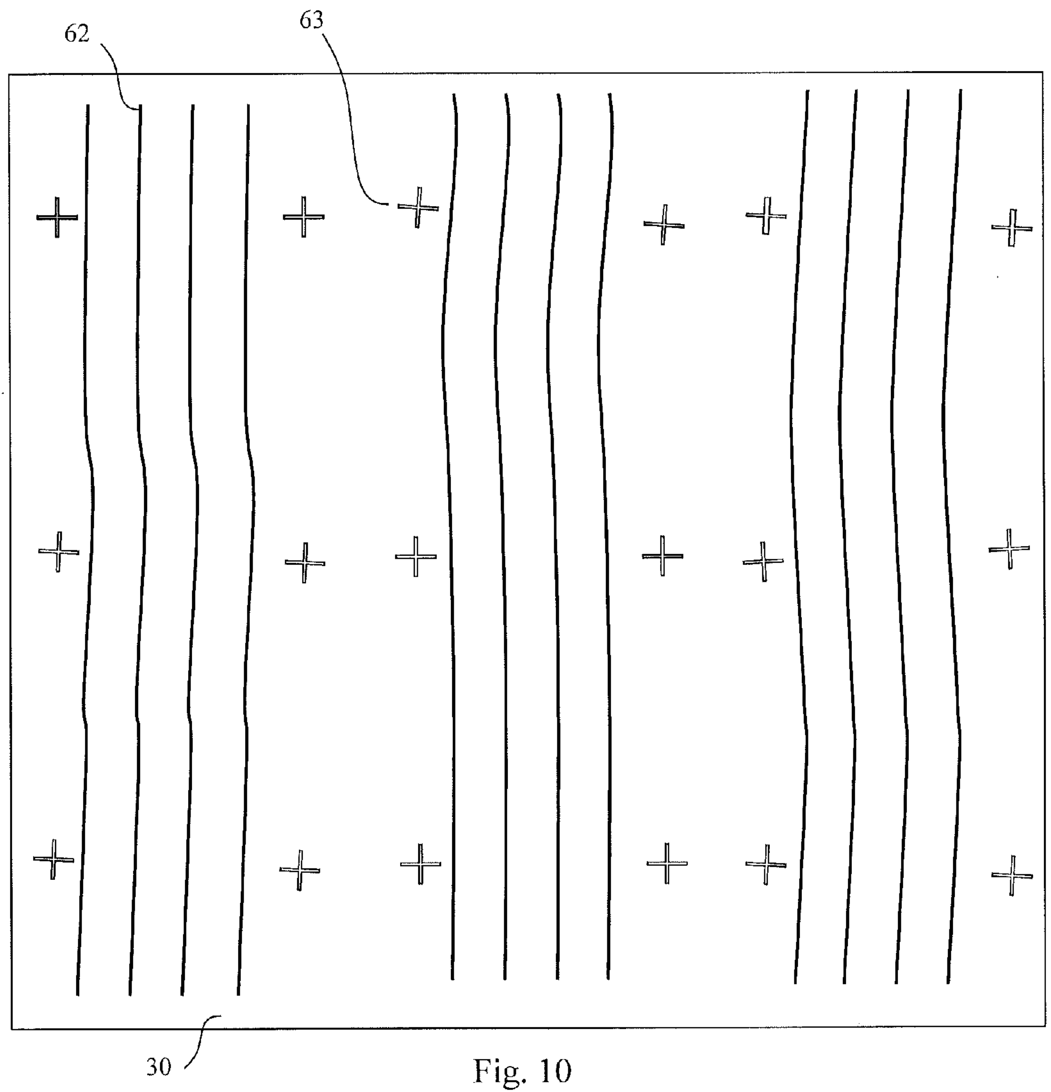
FIGS. 10 and 11 present schematic illustrations of a transfer process sequence according to embodiments of the invention, which can be used to interconnect an array of ultra-thin multi-terminal devices onto relatively large area rigid or plastic substrates.
Figure 11:
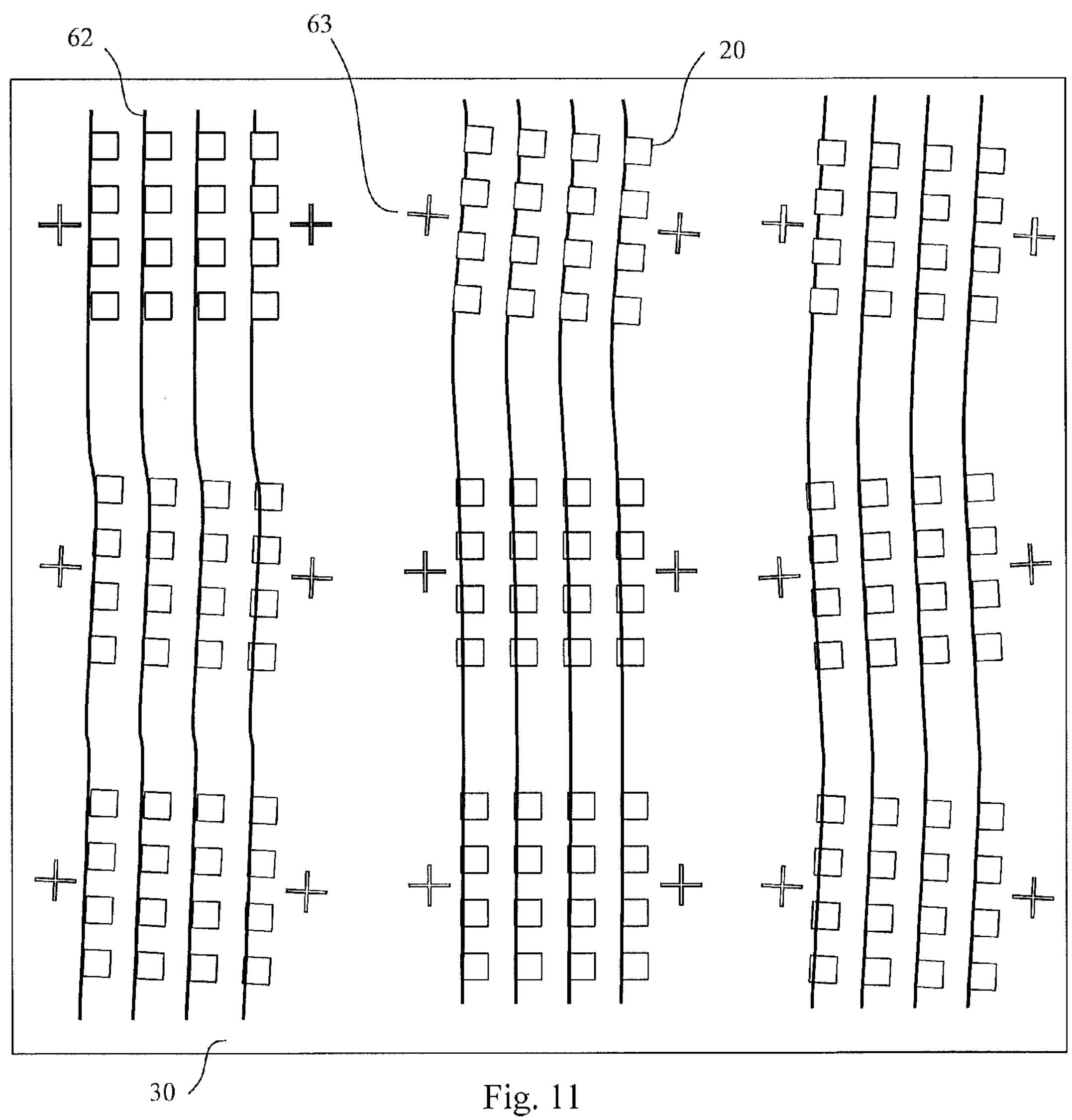

FIGS. 10 and 11 present schematic illustrations of a process sequence which can be used to interconnect a relatively large array of ultra-thin multi-terminals devices onto relatively large area rigid or plastic substrates. In particular, as shown in FIG. 10, a metal layer is deposited and patterned over the surface of a target substrate 30 to define an array of interconnects 62 and local alignment marks 63. In FIG. 11, arrays of ultra-thin multi-terminals devices 20 are transfer welded onto the interconnect lines 62 defined on the surface of the target substrate 30. Locally defined alignment marks 63 are used to align each array of transferred devices. Accordingly, in the embodiments described herein, the alignment registration accuracy is not a function of the size of the target substrate 30, but mainly a function of the size of the transfer stamp 10 which is used during the transfer welding operation. The achievable alignment accuracy is thus affected by local deformations (within each stamped array), rather than by large area (global) deformation of the target substrate 30.

The transfer welding integration approach according to embodiments described herein can also be used to improve transfer printing cycle throughput, which may be useful for applications requiring relatively large area target substrates. For example, multi-laser beams or fast scanning optics can be used to quickly transfer-weld a large array of dies in a time period which may be shorter than prior art transfer printing processes typically requiring slower (i.e. <1 mm/s) stamp delamination rates in order to achieve high transfer printing yield onto adhesive coated target substrates. In addition, as no adhesive is used on the target substrate, a continuous array of dies can be picked up from a source substrate and then selectively transfer welded onto the surface of a target substrate in successive print operations. In contrast with some conventional transfer printing processes, the transfer stamp does not necessarily need be repopulated with a new array of semiconductor dies after each selective print operation.

Figure 12A:
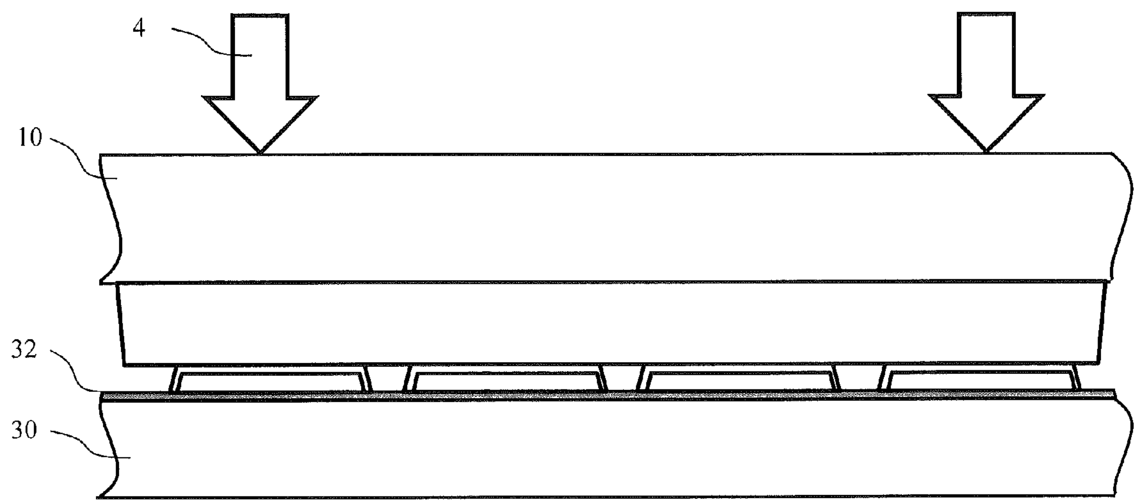
FIGS. 12*a-b* illustrate a transfer sequence of the invention permitting significant improvement of tool throughput on large area substrates through a reduction of the tool head travel distance.
Figure 12B:
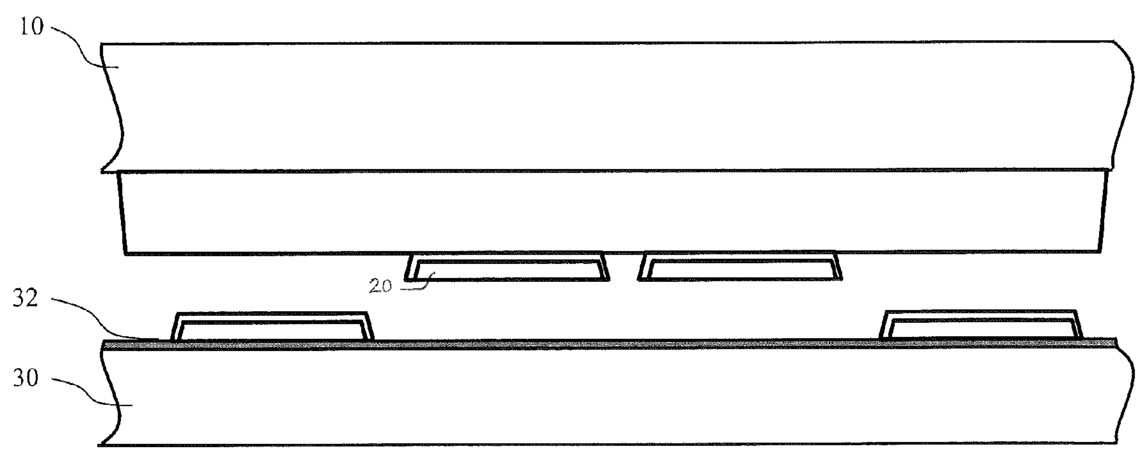

FIGS. 12*a*-*b* illustrate an application of the transfer sequence in accordance with embodiments of the invention, which can permit significant improvement of tool throughput on large area substrates through a reduction of the tool head travel distance. In particular, as shown in FIG. 12 *a*, a continuous array (i.e. non sparse) of semiconductor dies 20 are picked-up from a source wafer using a stamp 10, and the stamp 10 is pressed against a target substrate 30 such that the dies 20 are brought into contact with a eutectic stack 32 on the target substrate. A sparse array of the semiconductor dies 20 (e.g., a subset of the dies 20) are selectively laser welded onto the target substrate 30 by selectively exposing portions of the eutectic stack 32 to electromagnetic radiation (illustrated as a laser beam 4) to reflow the portions of the eutectic stack, thereby bonding the selected ones (but not all) of the semiconductor dies 20 thereto. As shown in FIG. 12*b*, the stamp 10 is then retracted and indexed over the target substrate 30 to a new print location. In subsequent transfer steps, additional sparse arrays of semiconductor dies can be selectively laser welded onto new print locations. Once the stamp 10 is fully depopulated (e.g., after multiple print operations), the transfer stamp 10 is realigned to the source substrate to pick up a new array of semiconductor dies 20.

Accordingly, embodiments of the present invention as described herein provide an electrically conductive eutectic layer which can be selectively reflowed in response to electromagnetic radiation to bond printable semiconductor components to target substrates. As the eutectic layer solidifies (e.g., transitions from a liquid phase to a solid phase) more quickly than typical transfer printing delamination rates, embodiments of the present invention offer advantages in comparison to other transfer printing approaches, for example, in terms of throughput and accuracy.

Although the invention has been described with reference to particular embodiments, it will be appreciated that variations and modifications may be made within the scope and spirit of the invention. Hence, it is intended that the above embodiments and all of such variations and modifications be included within the scope and spirit of the invention as defined by the claims that follow.

That which is claimed:

1. A method of printing transferable components, the method comprising:

providing a eutectic layer comprising a conductive material on a surface of a target substrate;

pressing a stamp including at least one transferable semiconductor component thereon on the target substrate such that the at least one transferable component and the surface of the target substrate contact opposite surfaces of the eutectic layer, wherein the at least one transferable semiconductor component comprises a plurality of semiconductor dies, wherein respective ones thereof are on respective protruding post features of the stamp;

during pressing of the stamp on the target substrate, exposing the at least one transferable component to electromagnetic radiation that is directed through the transfer stamp to reflow the eutectic layer; and then separating the stamp from the target substrate to delaminate the at least one transferable component from the stamp and print the at least one transferable component onto the surface of the target substrate.

2. The method of claim 1, wherein the stamp includes a transparent portion at least partially aligned with the at least one transferable component in plan view, and wherein exposing comprises exposing the at least one transferable component to the electromagnetic radiation through the transparent portion of the stamp.

3. The method of claim 2, wherein the electromagnetic radiation comprises laser radiation provided from a light source.

4. The method of claim 3, wherein the laser radiation heats the at least one transferable component, and wherein the at least one transferable component laterally spreads the heat over a surface thereof to reflow the eutectic layer.

5. The method of claim 3, wherein a bandgap of the at least one transferable semiconductor component is transparent to a wavelength of the laser radiation, and wherein the laser radiation heats the eutectic layer to reflow the eutectic layer.

6. The method of claim 1, wherein the surface of the target substrate comprises a rough surface, and wherein the eutectic layer provides a substantially planar interface with the at least one transferable component after the reflow thereof.

7. The method of claim 1, wherein the target substrate comprises an unpolished ceramic substrate, an unpolished polysilicon substrate, an unpolished metal substrate, a printed circuit board, and/or a plastic substrate, and wherein the surface of the target substrate including the eutectic layer thereon is free of an adhesive layer.

8. The method of claim 1, wherein the at least one transferable semiconductor component comprises a plurality of transferable semiconductor components on the stamp, and wherein exposing comprises:

selectively exposing ones of the plurality of transferable components to the electromagnetic radiation through the stamp to reflow portions of the eutectic layer in contact therewith without reflowing other portions of the eutectic layer, and wherein separating the stamp from the target substrate comprises:

separating the stamp from the target substrate to selectively delaminate the ones of the plurality of transferable components from the stamp without delaminating remaining ones of the plurality of transferable components.

9. The method of claim 8, wherein the plurality of transferable components comprises a continuous array of transferable components, and further comprising the following prior to pressing the stamp on the target substrate:

contacting the stamp with a source substrate including the array of transferable components thereon; and retracting the stamp from the source substrate to transfer the array of transferable components to the stamp, wherein the ones of the plurality of transferable components that are delaminated from the stamp comprise a subset of the array.

10. The method of claim 1, further comprising:

patterning the eutectic layer on the target substrate to define a plurality of eutectic patterns thereon prior to pressing the stamp on the target substrate, wherein the eutectic layer comprises a multi-layer stack including alternating layers of at least two different materials.

11. The method of claim 1, wherein the eutectic layer includes a first eutectic stack adjacent edge portions of the at least one transferable component, and a second eutectic stack between the edge portions, and wherein exposing comprises selectively exposing the edge portions of the at least one transferable component to the electromagnetic radiation to reflow the first eutectic stack without reflowing the second eutectic stack.

12. The method of claim 1, wherein the first eutectic stack comprises a material having a lower eutectic formation temperature than the second eutectic stack, wherein exposing comprises exposing at least one transferable component to the electromagnetic radiation to reflow the first eutectic stack at a temperature lower than the eutectic formation temperature of the second eutectic stack, and further comprising, heating the target substrate at a temperature sufficient to selectively reflow the second eutectic stack without reflowing an alloyed material formed upon reflow of the first eutectic stack.

13. The method of claim 12, wherein the second eutectic stack provides an ohmic contact to the at least one transferable component.

14. The method of claim 11, wherein the first eutectic stack comprises a metal alloy, and wherein the second eutectic stack comprises a metal-semiconductor alloy.

15. The method of claim 1, wherein the at least one transferable component comprises a first multi junction solar cell stacked on a second multi junction solar cell having a lower bandgap than the first multi junction solar cell, and wherein an interface between the first and second solar cells includes a eutectic material.

16. The method of claim 15, wherein the interface further includes at least one metal finger protruding from a recess in the second multi junction solar cell, and wherein the at least one metal finger includes the eutectic material thereon.

17. The method of claim 15, further comprising:

an intrinsically doped layer or a P-N diode structure along the interface between the first and second multi-junction solar cells; and a doped lateral current spreading layer on the intrinsically doped layer or P-N diode structure opposite the second solar cell.

18. The method of claim 1, further comprising:

identifying that the at least one transferable component printed on the target substrate is defective;

contacting the stamp with the at least one transferable component responsive to identifying that the at least one transferable component is defective;

exposing the at least one transferable component to second electromagnetic radiation that is directed through the stamp to reflow the eutectic layer; and then retracting the stamp including the at least one transferable component thereon from the target substrate while the eutectic layer is reflowed to delaminate the at least one transferable component from the target substrate.

19. The method of claim 1, wherein the at least one transferable component includes one or more metal finger layers protruding from a surface thereof, and wherein the eutectic layer is on the metal finger layers.

20. The method of claim 1, further comprising:

patterning a metal layer on the target substrate to define a metal interconnect line and a local alignment mark; and aligning the stamp with the local alignment mark on the target substrate prior to pressing the stamp on the target substrate.

21. The method of claim 1, wherein the at least one transferable component comprises a solar cell, light emitting diode, laser diode, or transistor.

22. A process for printing transferable components, comprising the steps of:

(a) providing a eutectic layer comprising a conductive material on a surface of a target substrate;

(b) pressing a stamp including at least one transferable semiconductor component thereon on the target substrate such that the at least one transferable component and the surface of the target substrate contact opposite surfaces of a the eutectic layer, wherein the at least one transferable semiconductor component comprises a plurality of semiconductor dies, wherein respective ones thereof are on respective protruding post features of the stamp;

(c) during pressing of the stamp on the target substrate, exposing the at least one transferable component to electromagnetic radiation that is directed through the transfer stamp to reflow the eutectic layer; and (d) separating the stamp from the target substrate to delaminate the at least one transferable component from the stamp and print the at least one transferable component onto the surface of the target substrate.

23. The process of claim 22, wherein the stamp includes a transparent portion at least partially aligned with the at least one transferable component in plan view, and wherein the step (c) of exposing comprises:

exposing the at least one transferable component to laser radiation through the transparent portion of the stamp.

24. The process of claim 22, wherein the at least one transferable semiconductor component comprises a plurality of transferable semiconductor components on the stamp, wherein the step (c) of exposing comprises:

selectively exposing ones of the plurality of transferable components to the electromagnetic radiation through the stamp to reflow portions of the eutectic layer in contact therewith without reflowing other portions of the eutectic layer, and wherein the step (d) of separating the stamp from the target substrate comprises:

separating the stamp from the target substrate to selectively delaminate the ones of the plurality of transferable components from the stamp without delaminating remaining ones of the plurality of transferable components.

25. The process of claim 22, further comprising the steps of:

(e) identifying that the at least one transferable component printed on the target substrate is defective;

(f) contacting the stamp with the at least one transferable component responsive to identifying that the at least one transferable component is defective;

(g) exposing the at least one transferable component to second electromagnetic radiation that is directed through the stamp to reflow the eutectic layer; and (h) retracting the stamp including the at least one transferable component thereon from the target substrate while the eutectic layer is reflowed to delaminate the at least one transferable component from the target substrate.

26. The method of claim 1, wherein the stamp is separated from the surface of the target substrate at a delamination rate of greater than 1 millimeter per second, and wherein the eutectic layer comprises a material configured to transition from a liquid phase to a solid phase more quickly than the delamination rate.

27. the method of claim 7, wherein a thickness of the eutectic layer is lower than a peak-to-valley roughness of the target substrate.

* * * * *

UNITED STATES PATENT AND TRADEMARK OFFICE
CERTIFICATE OF CORRECTION

PATENT NO. : 9,161,448 B2
APPLICATION NO. : 13/352876
DATED : October 13, 2015
INVENTOR(S) : Menard et al.

It is certified that error appears in the above-identified patent and that said Letters Patent is hereby corrected as shown below:

In the Specification:

Column 10, Line 36: Please correct "efficiency IIV multi-junction"
to read -- efficiency III-V multi-junction --

In the Claims:

Column 16, Claim 22, Line 45: Please correct "surfaces of a the"
to read -- surfaces of the --

Signed and Sealed this
Twenty-third Day of August, 2016

Michelle K. Lee
*Director of the United States Patent and Trademark Office*